(12) United States Patent
Wilz et al.

(10) Patent No.: US 10,547,305 B2
(45) Date of Patent: Jan. 28, 2020

(54) SWITCH BIASING USING ISOLATED NEGATIVE AND POSITIVE BIAS CIRCUITRY

(71) Applicant: SKYWORKS SOLUTIONS, INC., Woburn, MA (US)

(72) Inventors: Leo John Wilz, Cedar Rapids, IA (US); Jonathan Christian Crandall, Marion, IA (US); David Steven Ripley, Marion, IA (US); James Phillip Young, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/132,286

(22) Filed: Sep. 14, 2018

(65) Prior Publication Data

US 2019/0036524 A1  Jan. 31, 2019

Related U.S. Application Data

(63) Continuation of application No. 15/429,568, filed on Feb. 10, 2017, now Pat. No. 10,103,726.

(60) Provisional application No. 62/294,238, filed on Feb. 11, 2016.

(51) Int. Cl.
| | | |
|---|---|---|
| *H03K 17/16* | (2006.01) | |
| *H03K 19/0185* | (2006.01) | |
| *H03K 5/08* | (2006.01) | |
| *H02M 3/07* | (2006.01) | |
| *G05F 3/20* | (2006.01) | |
| *H03K 17/10* | (2006.01) | |
| *H03K 17/693* | (2006.01) | |
| *H04B 1/48* | (2006.01) | |

(52) U.S. Cl.
CPC .......... *H03K 17/162* (2013.01); *G05F 3/205* (2013.01); *H02M 3/07* (2013.01); *H03K 5/08* (2013.01); *H03K 17/102* (2013.01); *H03K 17/693* (2013.01); *H03K 19/018507* (2013.01); *H03K 2217/0018* (2013.01); *H03K 2217/0081* (2013.01); *H04B 1/48* (2013.01)

(58) Field of Classification Search
CPC .. H03K 17/693; H03K 17/063; H03K 17/102; H03K 17/14; H03K 17/162; H03K 17/60; H03K 3/02; H03K 3/353
USPC .......................... 327/108, 109, 333, 535, 539
See application file for complete search history.

(56) References Cited

U.S. PATENT DOCUMENTS

| | | | | |
|---|---|---|---|---|
| 2002/0145892 A1* | 10/2002 | Shor | ....................... | H02M 3/07 363/59 |
| 2007/0290744 A1* | 12/2007 | Adachi | ..................... | H03F 3/24 330/51 |
| 2013/0038505 A1* | 2/2013 | Iijima | ................... | H03K 17/063 343/876 |

\* cited by examiner

*Primary Examiner* — John W Poos
(74) *Attorney, Agent, or Firm* — Chang & Hale LLP

(57) ABSTRACT

A switch control circuit includes a positive voltage bias node, a voltage-regulated positive supply rail coupled to the positive voltage bias node, a charge pump coupled to a charge pump supply node, and a current source positive supply rail coupled to the charge pump supply node and configured to supply the charge pump.

16 Claims, 12 Drawing Sheets

US 10,547,305 B2

SWITCH BIASING USING ISOLATED NEGATIVE AND POSITIVE BIAS CIRCUITRY

CROSS-REFERENCE TO RELATED APPLICATION(S)

This application is a continuation of U.S. patent application Ser. No. 15/429,568, filed Feb. 10, 2017, entitled RADIO FREQUENCY SWITCHES WITH REDUCED CLOCK NOISE, which claims priority to U.S. Provisional Application No. 62/294,238, filed Feb. 11, 2016, and entitled RADIO FREQUENCY SWITCHES WITH REDUCED CLOCK NOISE, the disclosures of which are hereby incorporated by reference in their entirety.

BACKGROUND

Field

The present disclosure relates to radio-frequency (RF) switching devices.

Description of the Related Art

In electronics applications, RF switching devices can suffer from exposure to noise generated by associated circuitry.

SUMMARY

In accordance with a number of implementations, the present disclosure relates to a switch bias control circuit comprising a level shifter, voltage regulator circuitry configured to receive a voltage reference signal, provide a first voltage output at a first node and provide a second voltage output at a second node, the first node and the second node being at least partially isolated from one another, and coupling circuitry that couples the first node to the level shifter and couples the second node to a negative voltage generator. The switch bias control circuit may be configured to bias a silicon-on-insulator (SOI) switch.

In certain embodiments, the voltage regulator circuitry includes an amplifier configured to receive the voltage reference signal at a first port and provide an amplified signal based at least in part on the voltage reference signal to gates of each of first and second transistors, respectively. The first transistor may be coupled to a feedback path connected to a second port of the amplifier. For example, the first node may be coupled to a drain or source of the first transistor and the second node may be coupled to a drain or source of the second transistor. In certain embodiments, the first and second transistors are configured such that a current in the first transistor is at least partially mirrored in the second transistor.

The coupling circuitry may further couple the second node to an oscillator. In certain embodiments, the coupling circuitry includes a voltage clamp coupled to the second node. For example, the voltage clamp may include a diode connected across a capacitor between the second node and a ground reference.

In some implementations, the present disclosure relates to a method for controlling a radio frequency (RF) switch. The method comprises receiving a voltage reference signal, and generating a positive voltage output signal based at least in part on the voltage reference signal and providing the positive voltage output signal on a first path. The method further comprises generating a negative voltage generator supply signal based at least in part on the voltage reference signal and providing the negative voltage generator supply signal to a negative voltage generator on a second path, the first path and the second path being at least partially isolated from one another. The method further comprises receiving a negative voltage output signal from the negative voltage generator, selecting one of the positive voltage output signal and the negative voltage output signal, and providing the selected one of the positive voltage output signal and the negative voltage output signal to a gate of a switch to thereby at least partially control operation of the switch.

In certain embodiments, selecting the one of the positive voltage output signal and the negative voltage output signal is performed using a level shifter. Generating the positive voltage output signal may be performed at least in part by providing the voltage reference signal to a first port of an amplifier, generating an amplifier output signal, and providing the amplifier output signal to a gate of a first transistor, the first path being coupled to a drain or source of the first transistor. For example, generating the negative voltage generator supply signal may be performed at least in part by providing the amplifier output signal to a second transistor, the second path being coupled to a drain or source of the second transistor. In certain embodiments, the method further comprises feeding at least part of the positive voltage output signal back into a second port of the amplifier. The method may further comprise mirroring a current of the first transistor in the second transistor. In certain embodiments, the method further comprises providing the negative voltage generator supply signal to an oscillator. The method may further comprise clamping the negative voltage generator supply signal at a desired value. Said clamping may be performed using a diode connected across a capacitor connected between the second path and a ground reference.

In some implementations, the present disclosure relates to a switch bias control circuit comprising a voltage reference input and a first voltage regulator including a first amplifier coupled to the voltage reference input and a first transistor coupled to the first amplifier and configured to generate a first output signal at a first node coupled to a drain or source of the first amplifier. The switch bias control circuit further comprises a second voltage regulator including a second amplifier coupled to the voltage reference input and a second transistor coupled to the second amplifier and configured to generate a second output signal at a second node coupled to a drain or source of the second amplifier, the second node being at least partially isolated from the first node. In certain embodiments, the switch bias control circuit further comprises a level shifter coupled to the first node, the first output signal providing a positive voltage signal for biasing a switch, and an output signal from a negative voltage generator configured to receive the second output signal providing a negative voltage signal for biasing the switch.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DESCRIPTION

Figure 1:
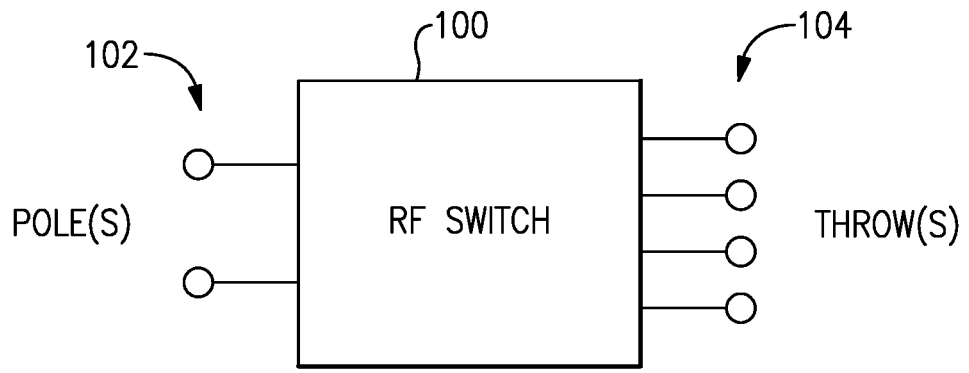
FIG. 1 is a block diagram illustrating a radio-frequency (RF) switch according to one or more embodiments.

The headings provided herein, if any, are for convenience only and do not necessarily affect the scope or meaning of the claimed invention.

Radio frequency (RF) switches may be used in various electronic devices and systems to connect and/or disconnect electrical paths between one or more poles and one or more throws. RF switches may be formed or constructed using various semiconductor-based technologies. For example, certain RF switches may be implemented using Silicon-on-Insulator (SOI) process technology, which may be advantageously utilized in certain radio-frequency (RF) circuits, including, for example, those involving high performance, low loss, high linearity switches. In such RF switching devices, performance advantages may result from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material. Although certain embodiments are disclosed herein in the context of SOI switches, it should be understood that principles disclosed herein may be applicable with respect to other technologies as well.

Certain RF switches may be constructed at least in part of an SOI transistor, which may be viewed as a 4-terminal field-effect transistor (FET) device with gate, drain, source, and body terminals; or alternatively, as a 5-terminal device, with an addition of a substrate node. Such terminals/nodes can be biased and/or be coupled one another to, for example, improve linearity and/or loss performance of the transistor. Various examples related to SOI and/or other semiconductor devices and circuits are described herein in greater detail. Although various examples are described in the context of RF switches, it will be understood that one or more features of the present disclosure may also be applicable in other applications. References to drain or source features of FET transistors herein should be understood to be substantially interchangeable in certain embodiments. For example, while a drain node of a FET may be disclosed in an embodiment, the description associated therewith may be applicable with respect to a source node instead, or vice versa; the orientation of the FET may be substantially immaterial, or non-critical, with respect to the particular feature or principle being described.

RF switches may use switched-capacitor circuits to generate negative gate bias voltages for an "OFF," or isolating, switch arm. Generation and/or provision of such bias voltages may be achieved using one or more clock-based switched-capacitor circuits. However, such circuits can become sources of noise, wherein clock spurs can up-convert onto the RF signal itself, or generate a higher wide-band noise floor, which may result in at least partially degraded receiver sensitivity.

In order to at least partially alleviate noise concerns, a switch device or module (e.g., SOI switch) may comprise or be associated with switch control architectures that do not comprise clock or negative voltage switch bias circuitry. Such controllers may function using a series blocking capacitors, wherein RF switch drain/source regions may be biased above ground during normal operation. However, such implementations may result in some amount of degradation with respect to insertion loss (e.g., approximately 0.05-0.2 dB) due to the added series capacitor impedance and reduced gate-to-source voltage (VGS) gate drive across the RF switch.

Certain embodiments disclosed herein provide for noise reduction in RF switches, such as SOI RF switches, while still allowing for the use of clock-based bias circuitry. Such systems/devices may allow for reduced clock noise without requiring series blocking capacitors, for example. In some implementations, the present disclosure relates to systems, devices and methods for providing isolation between RF switch gate bias circuitry and charge-pump and/or clock circuitry associated therewith, such as charge-pump and/or clock circuitry disposed on a common SOI switch die with the RF switch. Various embodiments/mechanisms are disclosed for achieving such noise reduction. For example, in certain embodiments, noise reduction is achieved through the at least partial integration of separate voltage regulators in an RF switch module. In certain embodiments, noise reduction may be achieved through the use of a voltage regulated positive supply rail for the RF switch gate bias and a current source positive supply rail to supply the charge-pump and/or clock circuitry. Certain embodiments of the present disclosure may provide various advantages over alternative systems, such as solutions omitting a charge-pump as described above, including improvement in the insertion loss of the switch (e.g., by approximately 0.05-0.2 dB) due to the absence of DC-blocking capacitor(s) and/or lower VGS biasing of the RF switch.

RF Switches

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
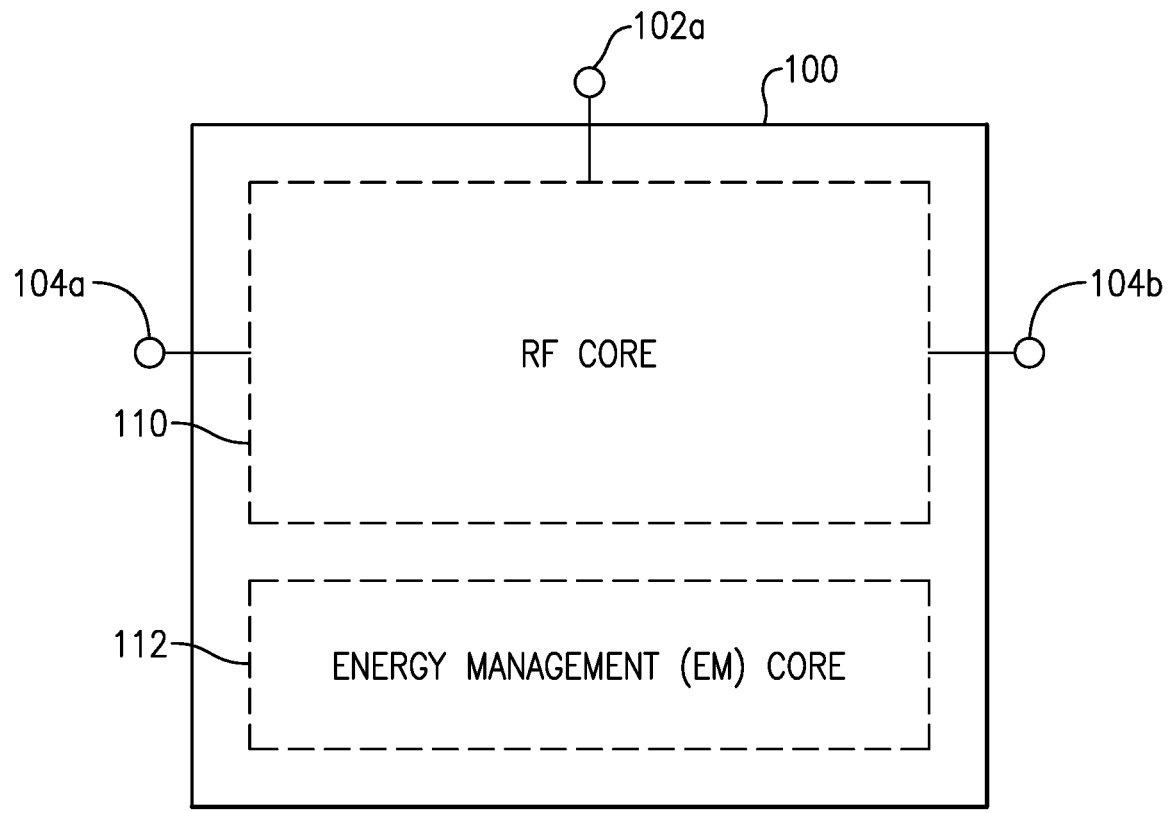
FIG. 2 is a block diagram illustrating an RF switch including an RF core and an energy management core according to one or more embodiments.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, the EM core 112 can be configured to supply, for example, voltage control signals to the RF core. For example, the EM core 112 may include certain clock-based bias control signal generation circuitry, such as one or more oscillators and/or negative voltage generators, which may be noise-producing components of the switch 100 in certain embodiments. The EM core 112 can be further configured to provide the RF switch 100 with logical decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
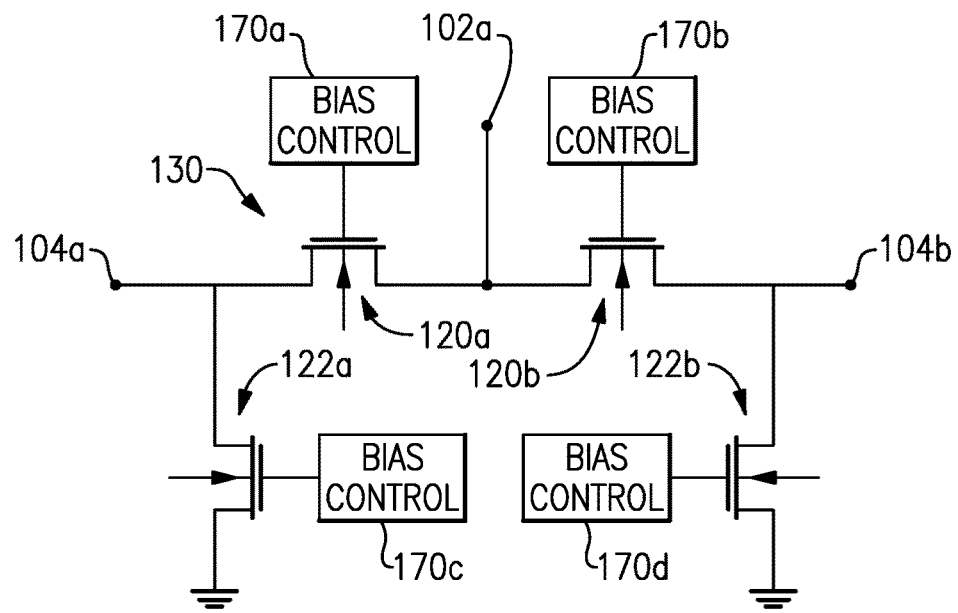
FIG. 3 shows an example of an RF switching configuration according to one or more embodiments.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via a FET 122a to provide shunting capability for the node 104a. Similarly, the second throw node 104b is shown to be coupled to the RF ground via an FET 122b to provide shunting capability for the node 104b. The first and second throw nodes may further each be coupled to an RF signal associated with a separate RF transmission band in certain embodiments.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. In certain embodiments, the FETs (120a, 120b, 122a, 122b) can be controlled by respective, or collective, gate bias control circuitry (170a-170d); the FETs may further be coupled to respective, or collective, body bias control circuitry (not shown). In some embodiments, gate bias control circuitry of FIG. 3 may include one or more features as described herein. For example, the control signal provided to the OFF-state FET(s) via respective gate bias control circuitry may be generated using oscillator and/or negative voltage generator circuitry, which may, in the absence of noise-reducing features as disclosed herein, generate certain noise that can be undesirably passed to some degree to the transmission signal. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

Figure 4:
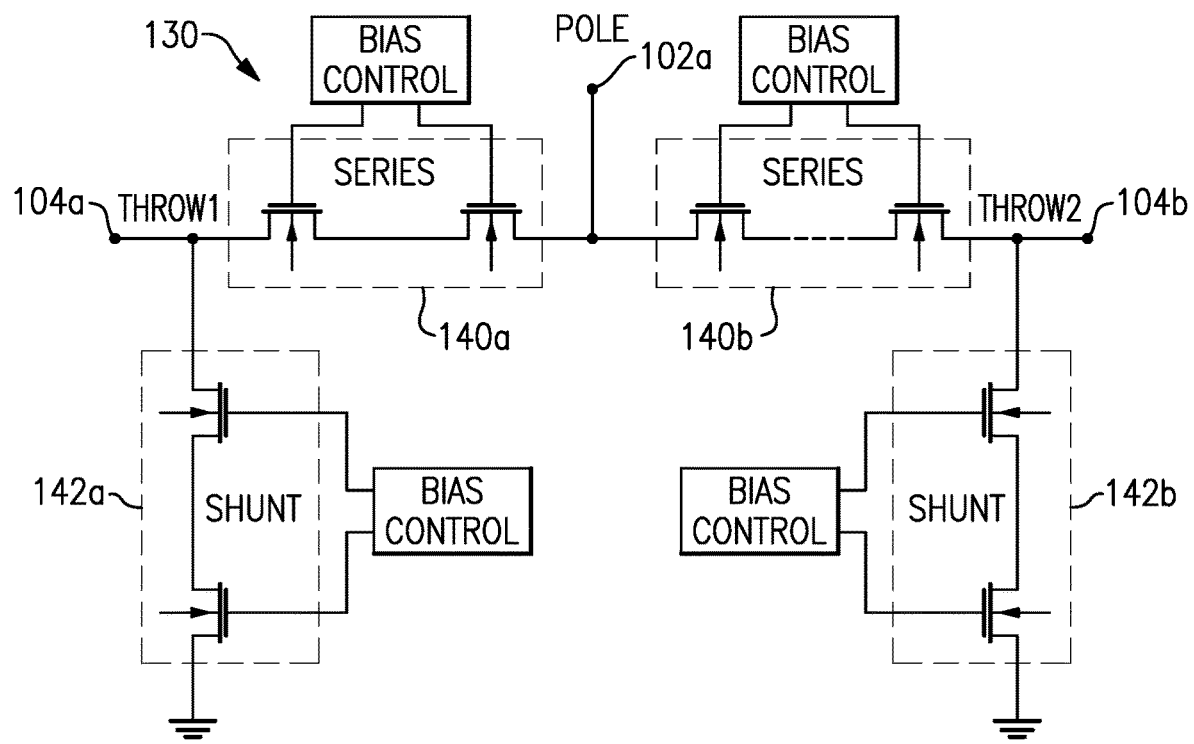
FIG. 4 shows an example of the RF core of FIG. 3, in which each of the switch arms includes a stack of FET devices.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs, configured in a transistor stack. Such a configuration is illustrated in FIG. 4, where series switches (140a, 140b) and/or shunt switches (142a, 142b) may include multiple transistor devices in series. Again, although described in the context of an SP2T configuration, it will be understood that RF cores having other numbers of poles and throws can also be implemented.

Figure 5:
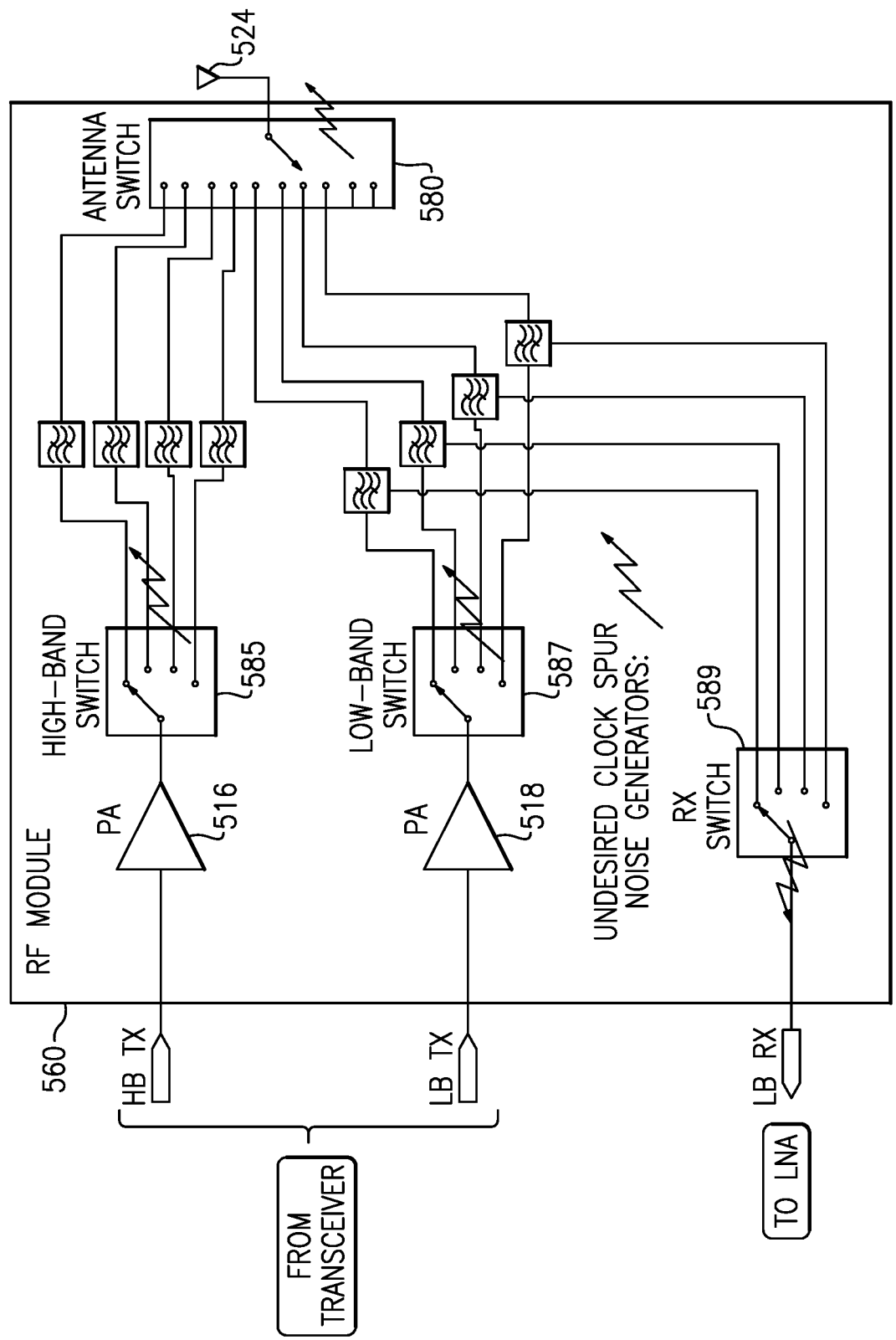
FIG. 5 illustrates an embodiment of an RF module including various switch modules according to one or more embodiments.

FIG. 5 illustrates an embodiment of an RF module 560 including various switch modules, which may be sources of noise in the RF module 560. For example, the RF module 560 may include one or more transmit path switches, such as the illustrated high-band switch 585 and low-band switch 587, which may provide duplexer functionality whereby a received signal may be directed to a channel of interest and provided on an associated port of an antenna switch module 580. The RF module 560 may further include one or more receive path switches, such as the illustrated switch 589. In certain embodiments, one or more of the switches of the RF module 560 are SOI switches.

The various switches of the RF module 560 may implement switched-capacitor circuits to generate negative gate bias voltages for OFF-arm switches. Such clock-based switched-capacitor circuits may produce certain amounts of noise resulting from clock spurs being up-converted onto the RF transmission signal, and may result in a higher wideband noise floor, thereby possibly degrading module sensitivity.

With regard to the receive path, clock-based harmonics and/or intermodulation (IMD) with the desired RF signal may create interference with the desired received signal. This intermodulation may be second-order, third-order, or higher. Intermodulation may typically occur in the receive switch 589 or in the receive LNA (not shown) with either the desired receive signal or the transmit signal. When the intermodulation product falls into the receiver frequency and has an amplitude greater than the receiver noise floor, then a measurable reduction in receive sensitivity may result when there is little or no filtering between the receive switch 589 and the LNA input. In addition, noise from the various other switches of the RF module 560 may also produce clock-based noise that may find its way into the transmit signal.

Figure 6:
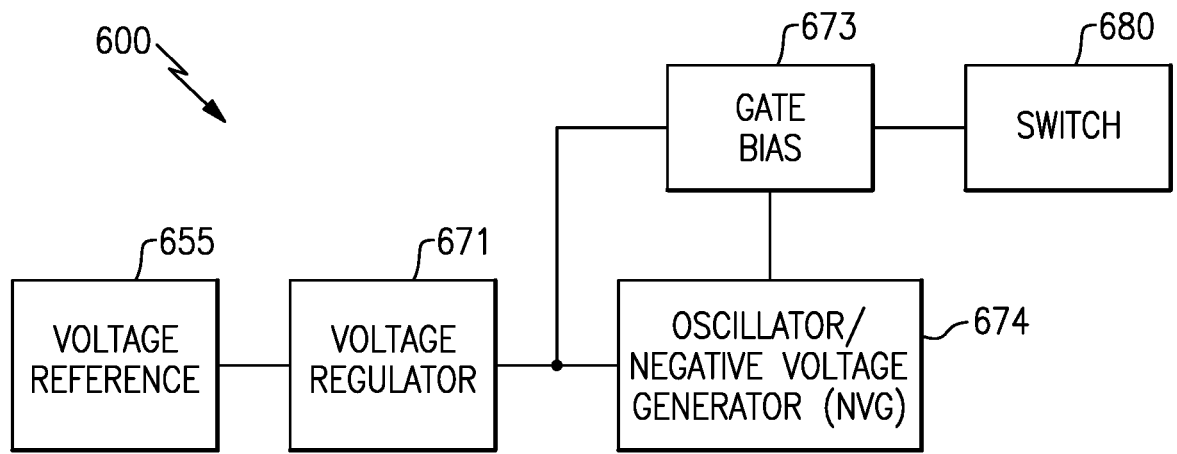
FIG. 6 is a block diagram illustrating RF circuitry including a switch configured to receive a gate bias signal from a gate bias module according to one or more embodiments.

FIG. 6 is a block diagram of RF circuitry 600 including a switch 680 configured to receive a gate bias signal from a gate bias module 673. The gate bias control signal may be generated at least in part by oscillator and/or negative voltage generator (NVG) circuitry 674. The switch 680 may be any type of RF switch, such as an antenna switch module (ASM), which may utilize, for example, dual-speed (e.g., 10 MHz or 2.5 MHz) switched-capacitor NVG, or may be a transmit or receive switch, and may utilize, for example, a single-speed 2.5 MHz switched-capacitor NVG. The signal provided by the voltage reference 655 may be conditioned by the voltage regulator 671 and provided to both the oscillator/NVG circuitry 674 and the gate bias 673. By connecting the oscillator/NVG 674 to the same reference voltage as the gate bias 673, noise generated in the oscillator/NVG circuitry 674 may be allowed to pass through to the transmit signal and through the switch 680.

Figure 7:
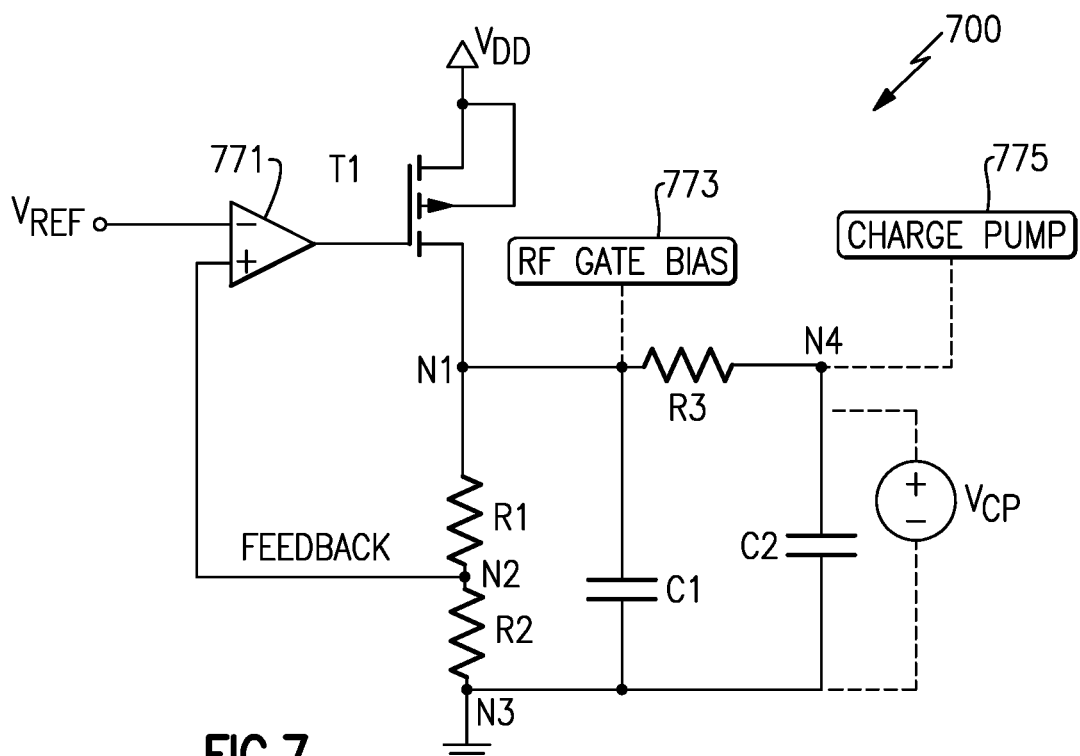
FIG. 7 is a diagram of RF circuitry comprising one or more noise-generating components according to one or more embodiments.

FIG. 7 is a diagram of radio frequency (RF) circuitry 700 comprising one or more noise-generating components. The circuitry 700 may provide an RF gate bias signal 773 at a resistor-capacitor (RC) filter including one or more resistors (e.g., R3) and one or more capacitors (e.g., C1, C2). A voltage regulator device 771 (e.g., operational amplifier (op-amp)), in combination with a transistor T1 and/or one or more additional components, may provide the bias voltage that is to be supplied to the gate of an RF switch (not shown) as a positive bias. The regulator device 771 may set the voltage at the output of the op-amp to the pass transistor T1.

The circuitry 700 may further comprise a voltage supply $V_{CP}$ (e.g., battery) configured to provide a voltage supply for a charge pump 775, connected at node N4, which may constitute a noise generator for the circuitry 700. The RF gate bias 773 and the charge pump 775 may therefore share a relatively low-output impedance voltage source, which is at least partially isolated by an RC filter. The voltage source $V_{DD}$ of the circuitry 700 may be used to set the voltage at node N1 and holds it at a substantially constant level with a feedback loop configured around the op-amp to thereby provide the voltage regulator functionality.

In certain embodiments, the circuitry 700 may be coupled to the gate of a switch to provide at least a positive voltage for placing the switch in an ON state. The voltage at N1 may be used for the positive voltage on the bias; however, the gate bias may further require a negative voltage as well for turning OFF the switch. To such end, the circuitry 775 may utilize the charge pump 775, which may be configured to takes the positive voltage reference and create a negative voltage from therefrom by, for example, charging capacitors and/or switching the capacitors so that the positive charge in the capacitor goes to ground, such that the negative side of the capacitor becomes a negative voltage. By switching the capacitors back-and-forth, however, the charge pump 775 may create noise in the circuitry 700. The circuitry 700 may further include one or more oscillators (not shown) configured to drive one or more switches that switch the capacitors of the charge pump 775.

Figure 8:
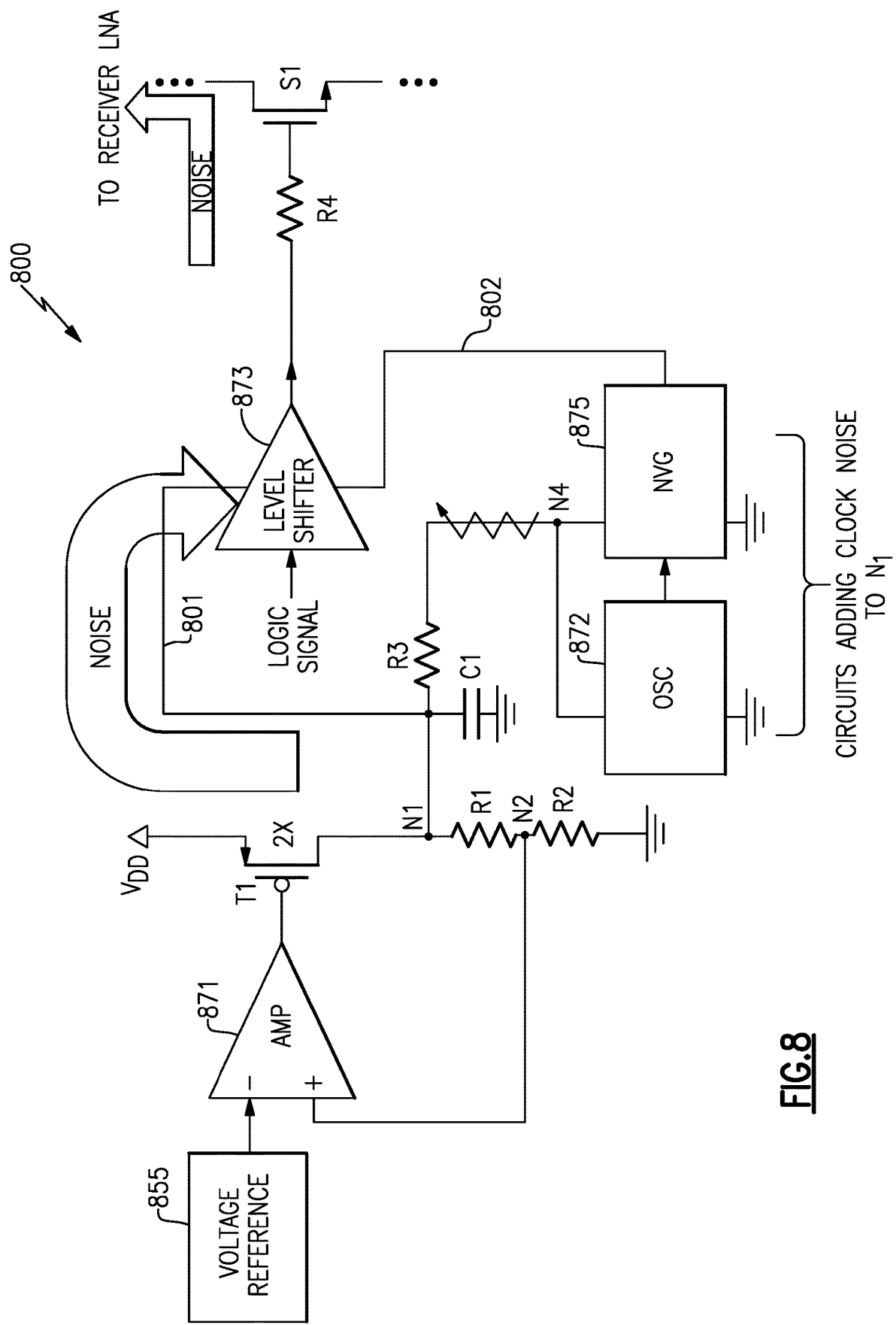
FIG. 8 is a diagram of radio frequency RF circuitry including one or more noise-generating components coupled to a common node with a positive voltage reference according to one or more embodiments.

FIG. 8 is a diagram of radio frequency (RF) circuitry 800 including one or more noise-generating components coupled to a common node N1 with a positive voltage reference. The circuitry 800 may be configured to provide positive and negative voltage bias signals to a switch S1, wherein the positive and negative voltage selection may be performed using, for example, a level shifter 873 controlled by a logic signal, as shown. The switch S1 may be one of a plurality of series-connected switches in certain embodiments and may be, for example, an SOI switch.

The circuitry 800 may include one or more oscillators (OSC) 872 and/or a negative voltage generator (NVG) 875, which may represent sub-circuits of the circuitry 800 that may add clock noise to a voltage reference signal provided at node N1. The terms "negative voltage generator," "NVG," and "charge pump" may be used substantially interchangeably herein in certain contexts. The circuitry 800 may further include a voltage reference 855, such as a temperature-compensated band-gap voltage reference that provides a substantially temperature-compensated output voltage (e.g., 1.2 V) to an op-amp 871 voltage regulator; that is, the voltage reference 855 may provide a voltage reference signal that is substantially independent of power supply and/or temperature.

The circuitry 800 may include voltage regulator circuitry including the op-amp 871, a pass transistor T1, and one or more resistor voltage dividers (e.g., R1, R2), with feedback to the negative or positive terminal of the amplifier 871. The values of the resistors R1, R2 may be selected to set the voltage gain around the amplifier/feedback loop (e.g., about 2 V, so that a 1.2 V reference 855 may become approximately 2.5 V) at the output N1, and holds the voltage level at N1. Although certain polarity of certain amplifiers may be shown in the figures and described herein, it should be understood that amplifiers in the various disclosed embodiments may have any practical or desirable polarity according to the particular application.

As described herein, the oscillator 872 and NVG may be sources of noise in the system. The voltage out of the NVG 875 may be used to turn OFF the switch S1. Therefore, the leakage to the output N1 may be less when the switch S1 is ON. The level shifter 873 may be coupled to two potential noise paths corresponding to the positive path 801 and the negative path 802. There may be a relatively lower level of noise coming off the NVG 875 into the negative pathway 802 for the level shifter 873. Therefore, in certain embodiments, the output of the NVG 875 may have additional filtering (not shown) to compensate.

In certain embodiments, the NVG 875 may be a charge pump that pumps the voltage of a charge into a capacitor, setting a voltage across the capacitor; the capacitor may be placed across the regulated output (e.g., 2.5 V) at N1) regulated output and charged up to the regulated voltage output level; the capacitor terminal polarity may be subsequently switched so that the capacitor positive terminal is tied to ground and the opposite terminal may be at a negative voltage level associated with the regulated voltage output level, thereby providing a negative output to bias the switch S1. In order to account for the small current that may discharge when the capacitor is switched and maintain the desired negative voltage bias level, one or more additional capacitors may be utilized for charging intermittently such that one is charged while the other is placed on the output. Therefore, at least one capacitor may be charged at all times while another is placed across ground.

Noise may also be present on the positive path 801 as a result of the gradual build-up when charging the output capacitor; because the voltage on the output capacitor cannot be changed instantaneously, and because current is required to charge the capacitor, the capacitor that has been switched off the output may have a charge level that is something less than the desired bias level. Therefore, when connected to the regulated voltage level, the capacitor may at least partially drag down the regulated voltage level until the output capacitor is charged back up. The noise from the oscillator 872 may also couple onto the output voltage at N1 for controlling the switch S1.

Figure 9:
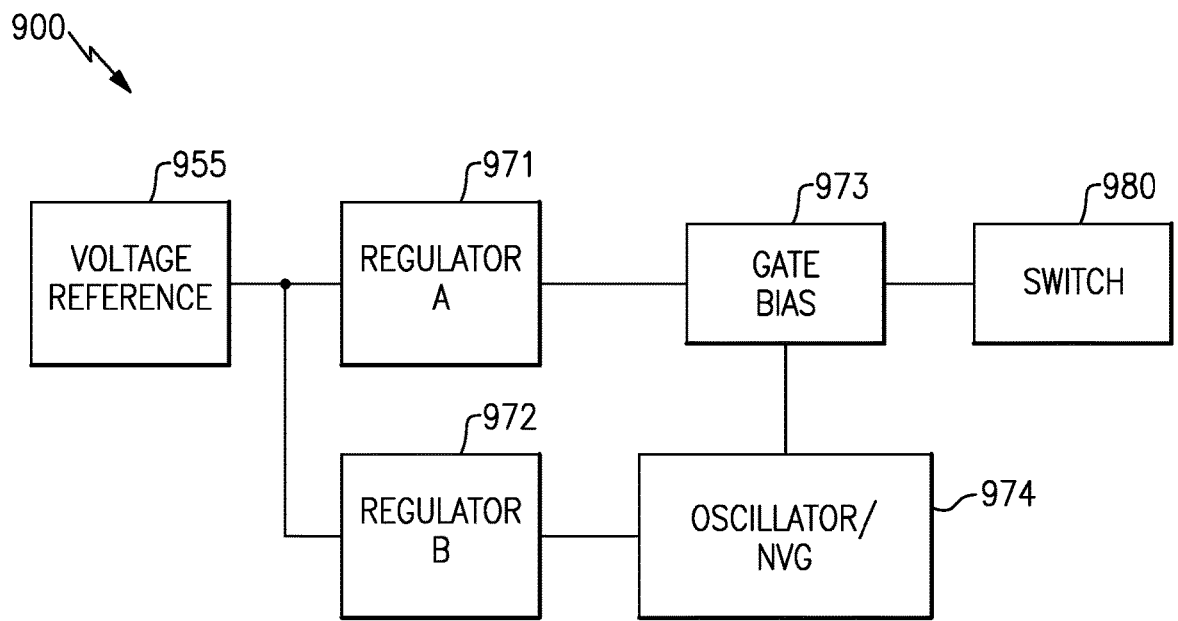
FIG. 9 is a diagram of RF circuitry configured to provide gate bias control from a gate bias node or module to control an RF switch with at least partially reduced clock noise according to one or more embodiments.

FIG. 9 is a diagram of radio frequency (RF) circuitry 900 configured to provide gate bias control from a gate bias node or module 973 to control an RF switch 980 with at least partially reduced clock noise. In order to isolate the regulated output voltage from the oscillator/NVG circuitry 974, the RF circuitry 900 may include separate voltage regulators 971 and 972. Additionally or alternatively, the RF circuitry may implement a separate voltage source positive supply rail for positive biasing and current source for supplying charge pump/clock circuits.

Figure 10:
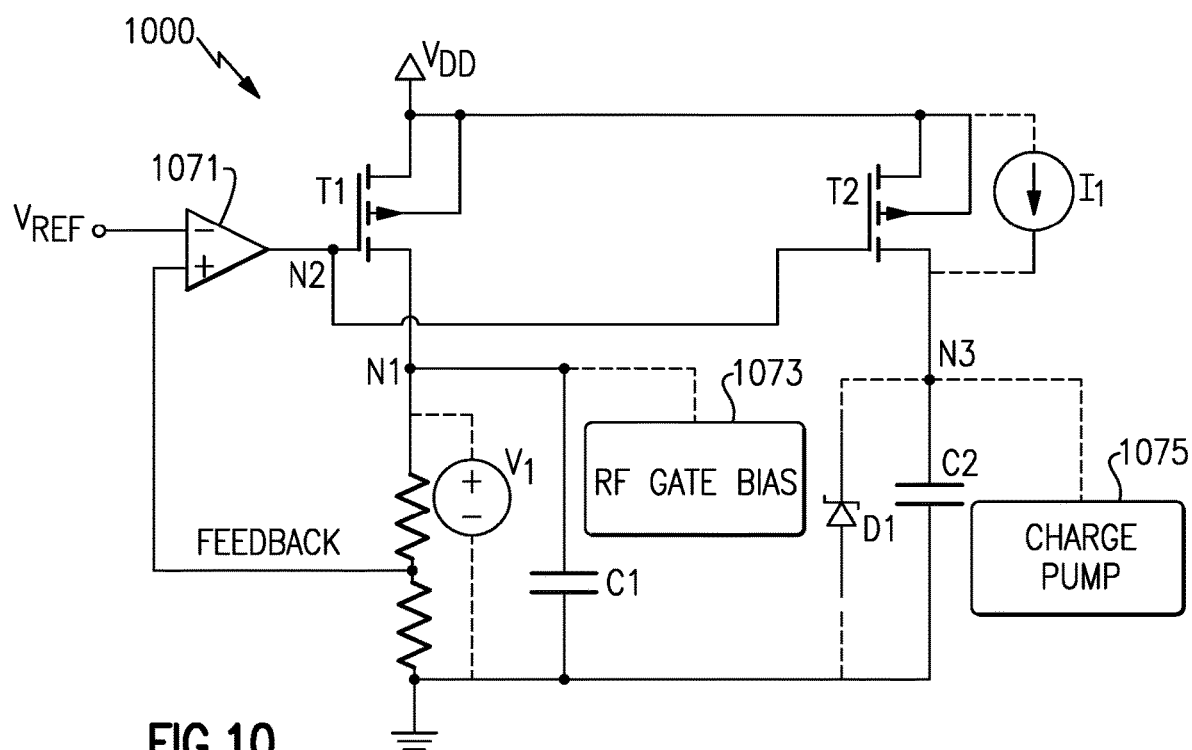
FIG. 10 is a diagram of RF circuitry including switch biasing circuitry having at least partially isolated outputs of the regulator according to one or more embodiments.

FIG. 10 is a diagram of RF circuitry 1000 including switch biasing circuitry having at least partially isolated outputs of the regulator. For example, one of the isolated outputs may be provided to a charge pump 1075, while another isolated output may be provided as the bias 1073 for the voltage of one or more switches. With the configuration of FIG. 10, noise may be at least partially isolated between the two outputs and not fed back into the gate of the switch(es).

Figure 11:
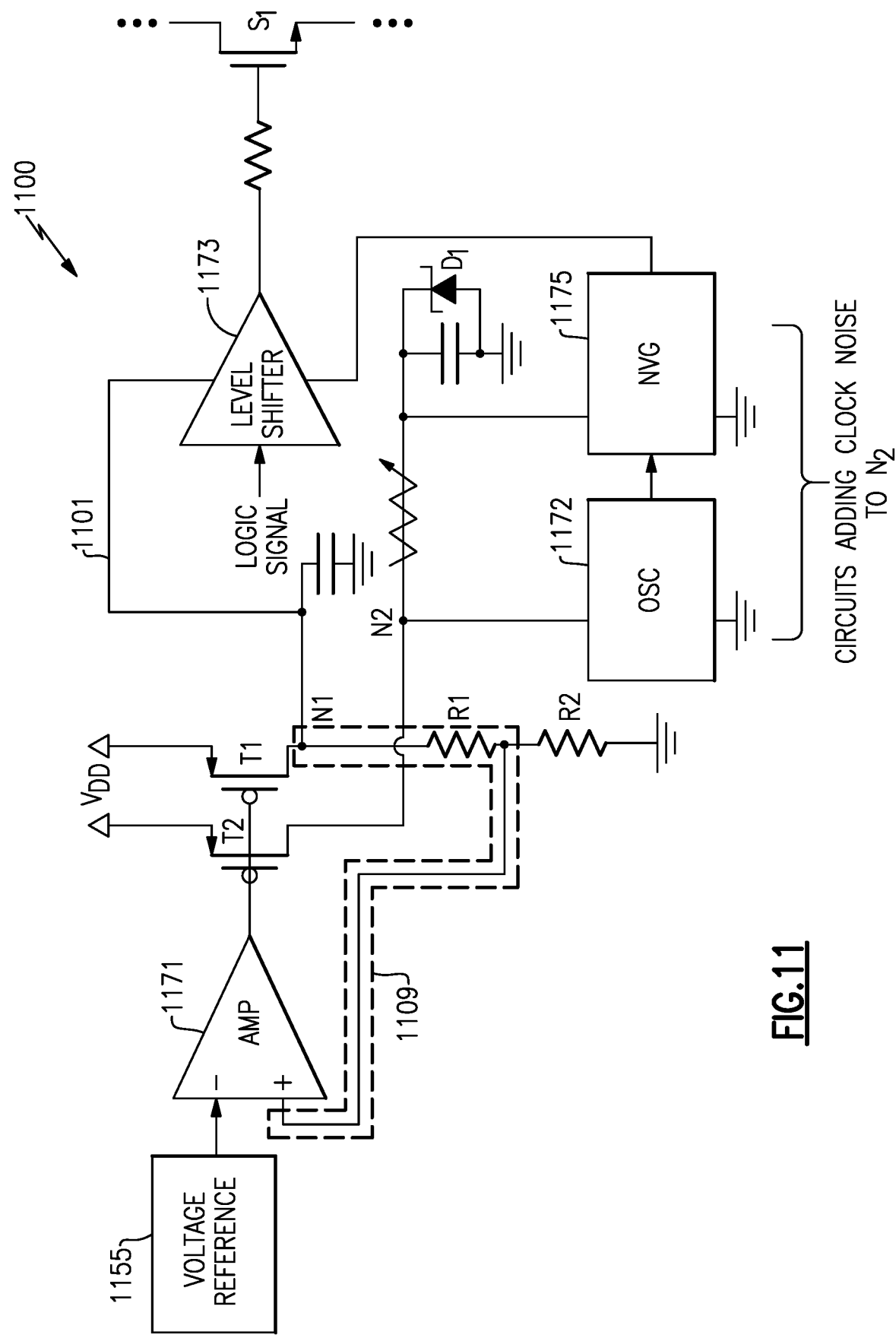
FIG. 11 is a diagram of RF circuitry including a dual-drive regulator configuration for reducing noise according to one or more embodiments.

The RF switch gate bias 1073 may use a low-output impedance voltage source V1 positive rail, while the charge-pump 1075 may utilize a separate low output-impedance current-source 11 positive rails respectively. In certain embodiments, the RF circuitry 1000 may further include an over-voltage protection clamp D1 (e.g. Zener diode, forward-biased diode stack, or comparator circuit) placed at the current-source output node N3 to prevent the supply node from drifting to the $V_{DD}$ rail FIG. 11 is a diagram of RF circuitry 1100 including a dual-drive regulator configuration for reducing noise according to one or more embodiments. The RF circuitry 1100 may provide a gate bias signal to a switch S1, which may be one of a plurality of switches biased by the RF circuitry 1100.

The node N1 may be connected to the voltage regulator comprising the amplifier 1171 and the transistor T1, and therefore may provide the regulated voltage (e.g., 2.5 V) positive rail. The positive supply path 1101 may be a quiet supply substantially isolated from the oscillator 1172 and/or NVG 1175 blocks, which may be clock noise sources.

The RF circuitry 1100 may comprise two separate pass transistors, T1 and T2, rather than a single pass transistor as is described above with respect to certain alternative embodiments. The pass transistor T1 may be disposed in the op-amp 1171 feedback loop. The drain (or source) of the transistor T1 may be coupled to voltage dividing resistors, and back to the op-amp 1171. The op-amp 1171 and the transistor T1 may hold the output voltage at node N1 at the voltage regulator output (e.g., 2.5 V), and that voltage may provide the positive bias 1101 to the level shifter 1173, which may be relatively free of clock noise due to the absence of oscillators and negative voltage generators associated therewith.

An additional supply signal may be provided from the transistor T2 that may also be coupled to the op-amp 1171, and therefore biased similarly to the transistor T1 at the gate. However, the drain of the transistor T2 may be isolated from the drain of the transistor T2, though not necessarily isolated from the oscillator 1172 and the NVG 1175. In the configuration of FIG. 11, the drain of the transistor T2 may behave more like a current source than a voltage source, unlike the transistor T1 in this configuration. The clock noise may be generated at the drain of T2, so that voltage may move up and down relatively dramatically. However, such voltage may not be coupled to T1 or N1, and may therefore be isolated from the positive voltage rail. The gates of one or more of the transistors T1, T2 may be inverted in certain embodiments.

The drains of transistors T1 and T2 may provide separate outputs that provide positive voltage references from separate regulators that are substantially isolated from one another. The drains of transistors T1 and T2, the voltage reference 1155, the amplifier 1171, and the resistor feedback loop associated with T1 may create a voltage reference at the drain of T1. Rather than using one common voltage regulator for all such circuits, the configuration of FIG. 11 provides for two of them, one for the level shifter 1173 and one for the oscillator 1172 and the NVG 1175, to thereby isolate the noise from one to the other. Furthermore, rather than using two regulators, one isolated from the other (see FIG. 12 and the description associated therewith below), certain embodiments provide for the mirroring of the current on the output N1 that is coupled to the feedback loop 1109 that sets the output voltage at the drain of T1 (e.g., maintains the output at 2.5 V). The current in T1 may be mirrored in T2 such that the oscillator 1172 and the NVG 1175 current draw is similar to the current draw on the level shifter 1173, then similar drain voltages at nodes N1 and N2 may result if the drain current draw of T1 is substantially the same as the current draw off of the drain of T2. Therefore, the configuration of FIG. 11 may provide for two regulated voltage outputs without creating two separate loops and/or two separate regulators; with the addition of a transistor, two outputs may be achieved.

In the current mirror configuration of FIG. 11, T1 may serve as the master in setting the bias point for T2. The current loading/load of T2 may essentially be balanced to T1. In certain embodiments, exact balancing may not be achieved, though such lack of exact balancing may not be overly problematic in applications where the accuracy of the voltage on the drain of T2 is not critical. For the regulated voltage provided to the oscillator 1172 and the NVG 1175, a sufficient supply for such devices may be all that is required. In certain embodiments, a diode D1 may be placed so that if the current loading from the NVG 1175 is sufficiently low, it may limit the peak voltage. The diode D1 (e.g., Zener diode) may be desirable because, since only the drain of T1 is regulated with feedback, the drain of T2 may drift up or drift down undesirably. The diode D1 may serve to prevent such drifting at least to an extent. Although a diode is shown, it should be understood that any type of voltage clamp may be used within the scope of the present disclosure, such as a stack of diodes. In certain embodiments, the low-frequency (e.g., MHz) isolation between N1 and N1 may be at least approximately 30 dB, which may decrease the switch gate clock noise by approximately 30 dB or more.

In certain embodiments, NVG noise may be reduced through the use of filtering (not shown), such as a combination of RC filters and/or sizing of FET devices within the NVG 1175, to reduce the amount of ripple. Furthermore, use of non-overlapping clocks may likewise provide a reduction in noise.

Figure 12:
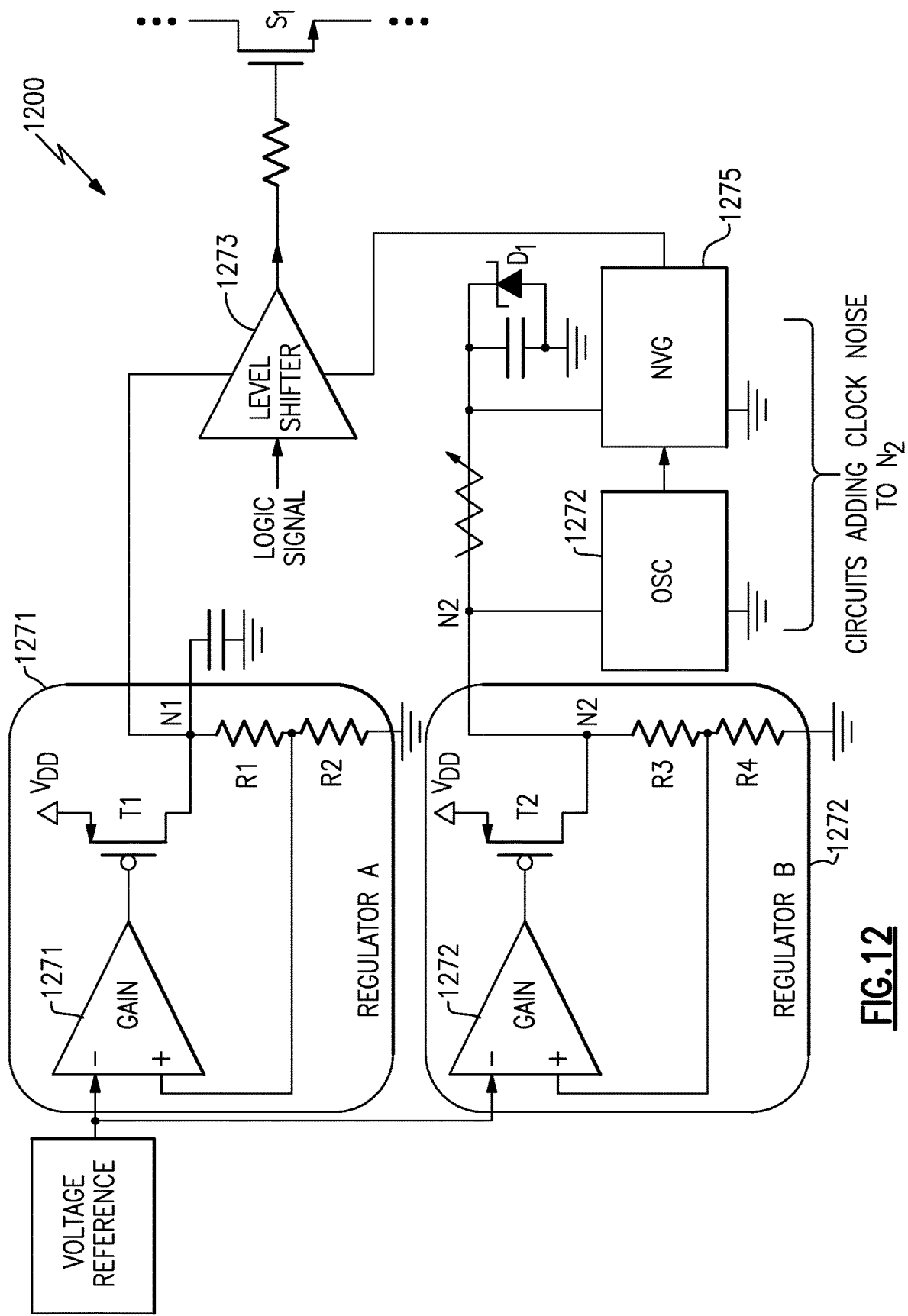
FIG. 12 is a diagram of circuitry including dual regulators for reducing clock noise according to one or more embodiment.

FIG. 12 is a diagram of an alternate embodiment of RF circuitry 1200 including dual regulators for reducing clock noise. The circuitry 1200 may include two separate regulators, regulator A 1271 and regulator B 1272. As shown, the output of regulator A at N1, which is provided as a positive supply to the level shifter 1273, is isolated from the output of regulator B at N2, which is provided as a positive supply to the oscillator 1272 and the NVG 1275.

Figure 13:
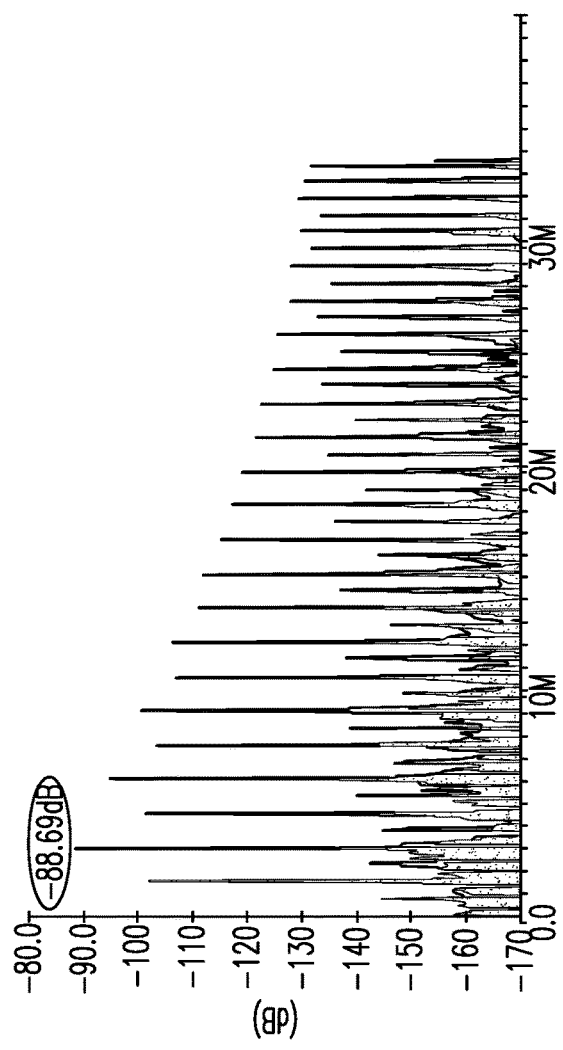
FIG. 13 provides a frequency domain graphical representation of noise power in a switch circuit including single voltage supply topology according to one or more embodiments.

FIG. 13 provides a frequency domain graphical representation of noise power in a switch circuit including single voltage supply topology according to one or more embodiments disclosed herein. Each vertical line may represent a different frequency, wherein the distance between the noise spurs represented by the vertical lines may be determined by the clock rate. The noise level at the fundamental frequency is identified/labeled, and shows an example of approximately 90 dBm using a logarithmic power scale. The noise power may be measured at a source or drain of the switch transistor (e.g., FET). The graph of FIG. 13 shows that clock-based noise may couple onto the RF transmit signal in certain configurations.

Figure 14:
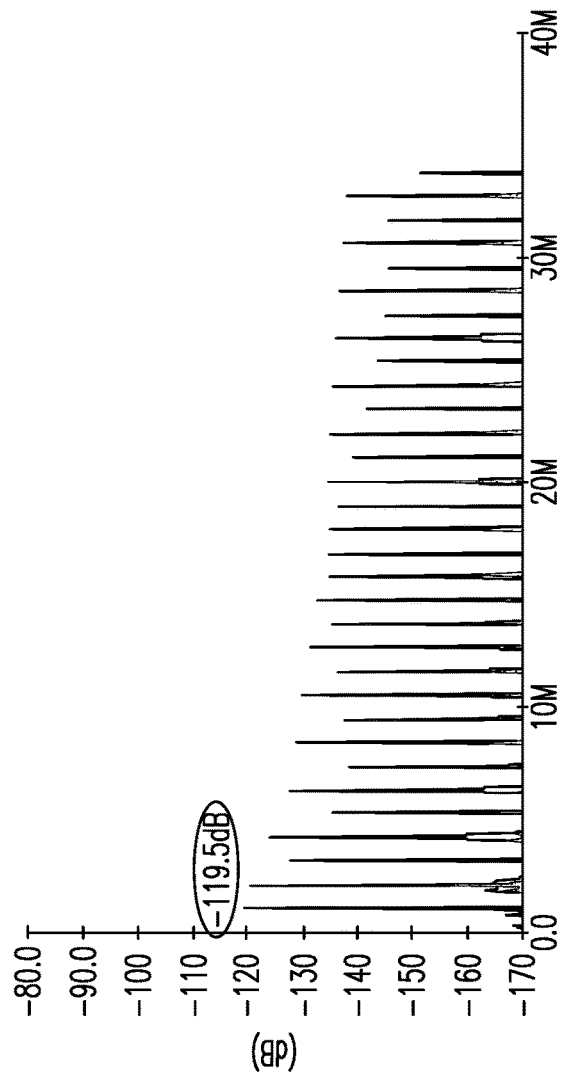
FIG. 14 is a graph showing noise power in a switch circuit implementing dual, isolated voltage and current supplies according to one or more embodiments.

FIG. 14 is a graph showing noise power in a switch circuit implementing dual, isolated voltage and current supplies, as shown in FIG. 11 and described above. According to an example embodiment, the noise, as indicated in the graph, may be lower by 25-30 dB, or more, when output supply isolation is implemented according to certain embodiments disclosed herein.

Packaged Module Implementation

Figure 15A:
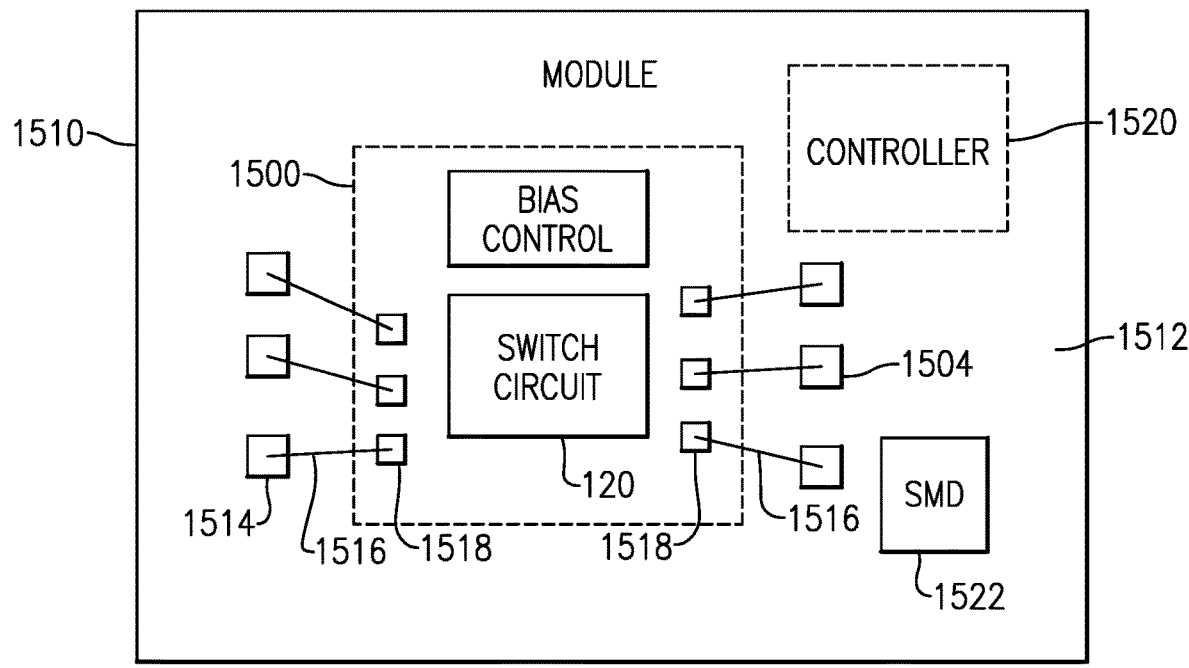
FIGS. 15A and 15B show plan and side views, respectively, of a packaged module having one or more features as described herein.

In some embodiments, one or more die having one or more features described herein can be implemented in a packaged module. An example of such a module is shown in FIGS. 15A (plan view) and 15B (side view). Although described in the context of both of the switch circuit and the bias control circuit being on the same die (e.g., example configuration of FIG. 15A), it will be understood that packaged modules can be based on other configurations.

A module 1510 is shown to include a packaging substrate 1512. Such a packaging substrate can be configured to receive a plurality of components, and can include, for example, a laminate substrate. The components mounted on the packaging substrate 1512 can include one or more dies. In the example shown, a die 1500 having a switching circuit 120 and a bias/coupling circuit 150 is shown to be mounted on the packaging substrate 1512. The die 1500 can be electrically connected to other parts of the module (and with each other where more than one die is utilized) through connections such as connection-wirebonds 1516. Such connection-wirebonds can be formed between contact pads 1518 formed on the die 1500 and contact pads 1514 formed on the packaging substrate 1512. In some embodiments, one or more surface mounted devices (SMDs) 1522 can be mounted on the packaging substrate 1512 to facilitate various functionalities of the module 1510.

In some embodiments, the packaging substrate 1512 can include electrical connection paths for interconnecting the various components with each other and/or with contact pads for external connections. For example, a connection path 1532 is depicted as interconnecting the example SMD 1522 and the die 1500. In another example, a connection path 1532 is depicted as interconnecting the SMD 1522 with an external-connection contact pad 1534. In yet another example a connection path 1532 is depicted as interconnecting the die 1500 with ground-connection contact pads 1536.

In some embodiments, a space above the packaging substrate 1512 and the various components mounted thereon can be filled with an overmold structure 1530. Such an overmold structure can provide a number of desirable functionalities, including protection for the components and wirebonds from external elements, and easier handling of the packaged module 1510.

Figure 15B:
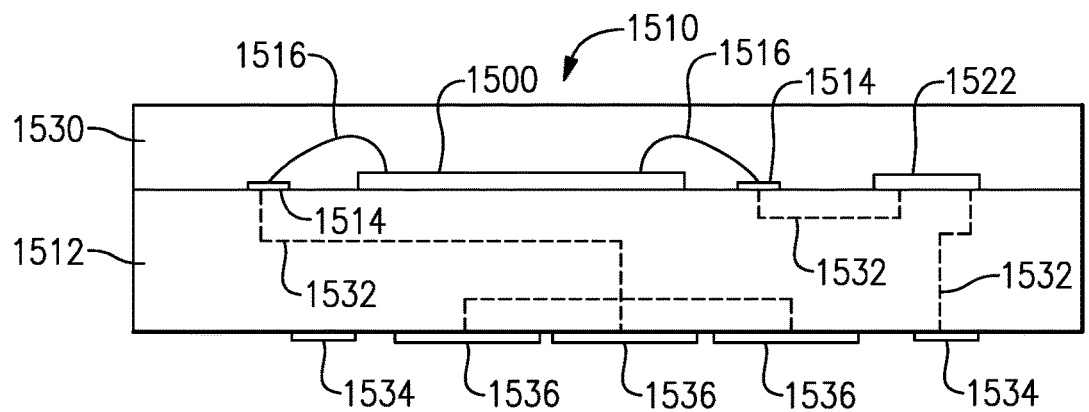
Figure 16:
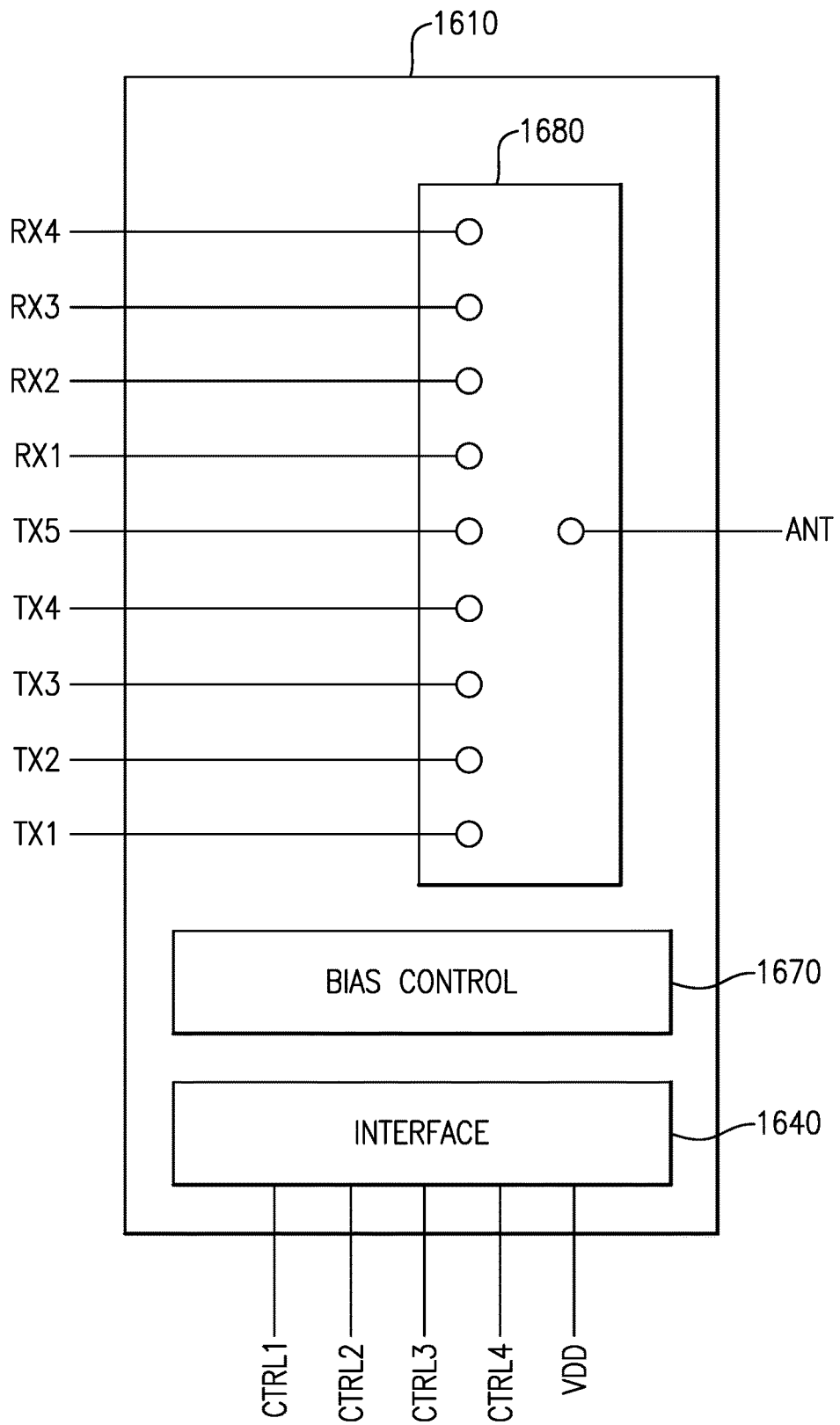
FIG. 16 shows a schematic diagram of an example switching configuration that can be implemented a module according to one or more embodiments.

FIG. 16 shows a schematic diagram of an example switching configuration that can be implemented in the module 1510 described in reference to FIGS. 15A and 15B. In the example, the switch circuit 1680 is depicted as being an SP9T switch, with the pole being connectable to an antenna and the throws being connectable to various Rx and Tx paths. Such a configuration can facilitate, for example, multi-mode multi-band operations in wireless devices.

The module 1610 can further include an interface 1640 for receiving power (e.g., supply voltage $V_{DD}$) and control signals to facilitate operation of the switch circuit 1680 and/or the bias control circuit 1670. In some implementations, supply voltage and control signals can be applied to the switch circuit 1680 via the bias/coupling circuit 1670.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 17:
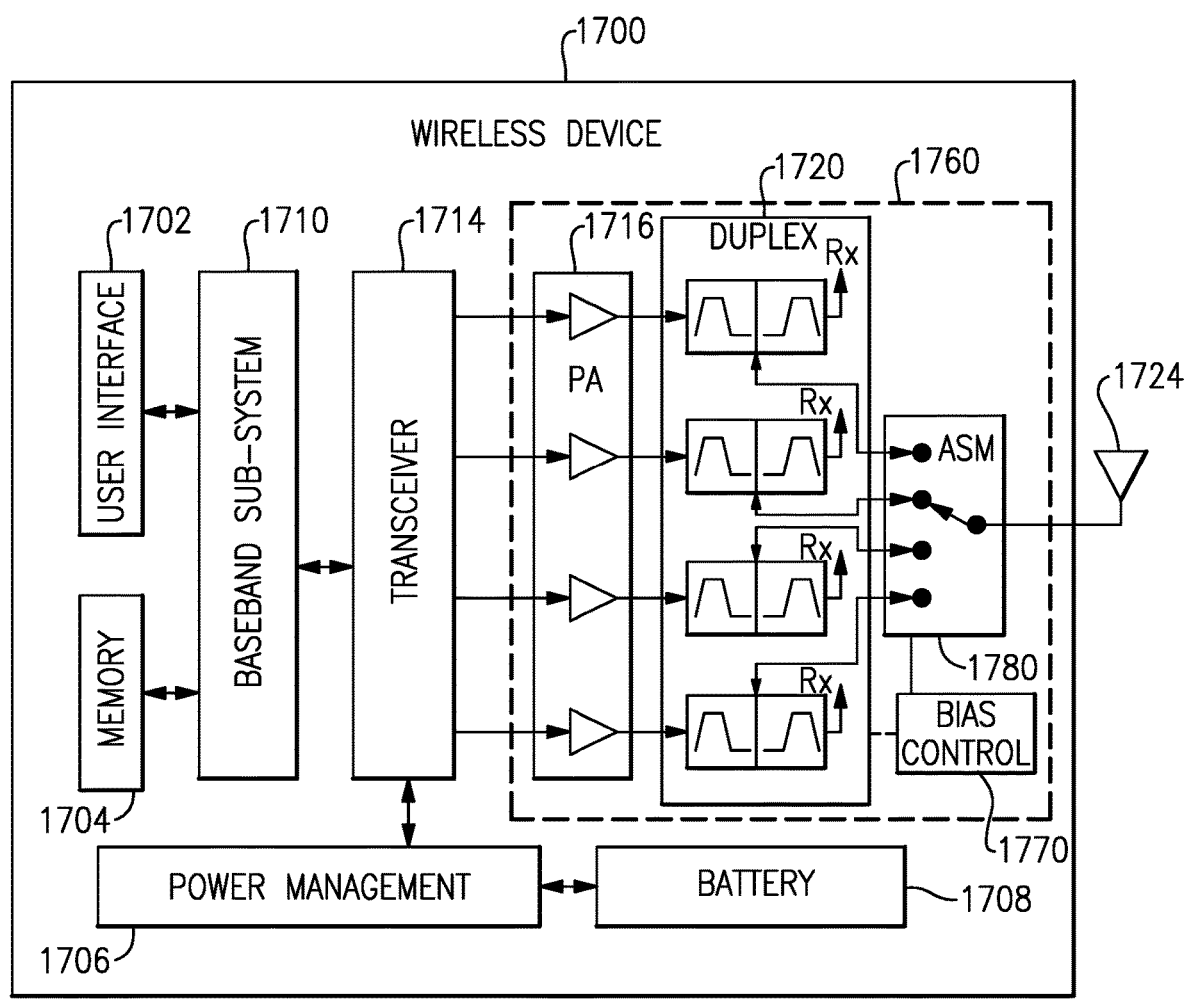
FIG. 17 depicts an example wireless device having one or more advantageous features described herein.

FIG. 17 schematically depicts an example wireless device 1700 having one or more advantageous features described herein. In the context of various switches and various bias control configurations as described herein, an antenna switch module (ASM) 1780 and a bias control circuit 1770 can be part of a module 1760. The ASM 1780 and the bias control module 1770 may be part of a single module or circuit in some implementations. In some embodiments, such a switch module can facilitate, for example, multi-band multi-mode operation of the wireless device 1700. Although only the ASM switch 1780 is specifically illustrated as being associated with the bias control circuit 1770, various other switches and/or switch module may be incorporated in the wireless device 1700, such as in the duplexer module 1720, and such switches/switch modules may be associated with bias control circuitry including isolated voltage regulated output signals for positive bias control and oscillator/NVG supply, as described above.

In the example wireless device 1700, a power amplifier (PA) module 1716 having a plurality of PAs can provide an amplified RF signal to the switch 1780 (via a duplexer 1720), and the switch 1780 can route the amplified RF signal to an antenna. The PA module 1716 can receive an unamplified RF signal from a transceiver 1714 that can be configured and operated in known manners. The transceiver can also be configured to process received signals. The transceiver 1714 is shown to interact with a baseband sub-system 1710 that is configured to provide conversion between data and/or voice signals suitable for a user and RF signals suitable for the transceiver 1714. The transceiver 1714 is also shown to be connected to a power management component 1706 that is configured to manage power for the operation of the wireless device 1700. Such a power management component can also control operations of the baseband sub-system 1710 and the module 1760.

The baseband sub-system 1710 is shown to be connected to a user interface 1702 to facilitate various input and output of voice and/or data provided to and received from the user. The baseband sub-system 1710 can also be connected to a memory 1704 that is configured to store data and/or instructions to facilitate the operation of the wireless device, and/or to provide storage of information for the user.

In some embodiments, the duplexer 1720 can allow transmit and receive operations to be performed simultaneously using a common antenna (e.g., 1724). In FIG. 17, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A switch control circuit comprising:
a positive voltage bias node;
a voltage-regulated positive supply rail coupled to the positive voltage bias node;
a charge pump coupled to a charge pump supply node;
a current source positive supply rail coupled to the charge pump supply node and configured to supply the charge pump; and
over-voltage protection clamp circuitry coupled to the charge pump supply node, the over-voltage protection clamp circuitry including a diode and a capacitor in parallel.

2. The switch control circuit of claim 1, wherein the positive voltage bias node is at least partially isolated from the charge pump supply node.

3. The switch control circuit of claim 1 wherein the over-voltage protection clamp circuitry includes a comparator circuit.

4. A switch control circuit comprising:
a positive voltage bias node;
a voltage-regulated positive supply rail coupled to the positive voltage bias node;
a charge pump coupled to a charge pump supply node;
a current source positive supply rail coupled to the charge pump supply node and configured to supply the charge pump; and
over-voltage protection clamp circuitry coupled to the charge pump supply node, the over-voltage protection clamp circuitry including a diode stack.

5. A switch control circuit comprising:
a positive voltage bias node;
a voltage-regulated positive supply rail coupled to the positive voltage bias node;
a charge pump coupled to a charge pump supply node;
a current source positive supply rail coupled to the charge pump supply node and configured to supply the charge pump; and
level shifter circuitry configured to receive a positive bias voltage from the positive voltage bias node and receive a negative bias voltage from the charge pump.

6. The switch control circuit of claim 5 wherein the level shifter circuitry is further configured to provide a bias output to control one or more transistors of a switch circuit.

7. A switch control circuit comprising:
a positive voltage bias node;
a voltage-regulated positive supply rail coupled to the positive voltage bias node;
a charge pump coupled to a charge pump supply node;
a current source positive supply rail coupled to the charge pump supply node and configured to supply the charge pump;
a first transistor having a drain or source coupled to the positive voltage bias node and a second transistor having a drain or source coupled to the charge pump supply node; and
an amplifier having an output coupled to a gate of the first transistor, a first input coupled to a voltage reference, and a second input coupled to the positive voltage bias node via a coupling path.

8. The switch control circuit of claim 7 wherein the coupling path includes a resistor.

9. A radio-frequency module comprising:
a packaging substrate configured to receive a plurality of components;
switch biasing circuitry implemented on the packaging substrate, the switch biasing circuitry including a positive voltage bias node, a voltage source coupled to the positive voltage bias node, a negative voltage generator coupled to a negative voltage generator supply node, and a current source coupled to the negative voltage generator supply node and configured to supply the negative voltage generator; and a first transistor and a second transistor, the voltage source providing a constant voltage between a drain or source of the first transistor and a ground reference, the current source providing a constant current across a source and a drain of the second transistor.

10. The radio-frequency module of claim 9 wherein the drain or source of the first transistor is coupled to an input terminal of an operational amplifier in a feedback configuration.

11. A radio-frequency module comprising:

a packaging substrate configured to receive a plurality of components;

switch biasing circuitry implemented on the packaging substrate, the switch biasing circuitry including a positive voltage bias node, a voltage source coupled to the positive voltage bias node, a negative voltage generator coupled to a negative voltage generator supply node, and a current source coupled to the negative voltage generator supply node and configured to supply the negative voltage generator; and voltage clamp circuitry coupled to the negative voltage generator supply node.

12. A radio-frequency module comprising:

a packaging substrate configured to receive a plurality of components; and switch biasing circuitry implemented on the packaging substrate, the switch biasing circuitry including a positive voltage bias node, a voltage source coupled to the positive voltage bias node, a negative voltage generator including charge pump circuitry coupled to a negative voltage generator supply node, and a current source coupled to the negative voltage generator supply node and configured to supply the negative voltage generator.

13. A switch control circuit comprising:

a positive voltage bias node;

a first voltage regulator coupled to the positive voltage bias node and configured to provide a first positive voltage supply at an output of the first voltage regulator;

a second voltage regulator coupled to the positive voltage bias node and configured to provide a second positive voltage supply at an output of the second voltage regulator that is at least partially electrically isolated from the output of the first voltage regulator;

negative voltage generator circuitry coupled to the output of the second voltage regulator and configured to provide a negative voltage supply at an output of the negative voltage generator; and biasing circuitry configured to receive the first positive voltage supply and the negative voltage supply and selectively provide one of the first positive voltage supply and the negative voltage supply at an output of the biasing circuitry.

14. The switch control circuit of claim 13 wherein the biasing circuitry includes level shifter circuitry.

15. A switch control circuit comprising:

a positive voltage bias node;

a first voltage regulator coupled to the positive voltage bias node and configured to provide a first positive voltage supply at an output of the first voltage regulator;

a second voltage regulator coupled to the positive voltage bias node and configured to provide a second positive voltage supply at an output of the second voltage regulator that is at least partially electrically isolated from the output of the first voltage regulator;

negative voltage generator circuitry coupled to the output of the second voltage regulator and configured to provide a negative voltage supply at an output of the negative voltage generator; and oscillator-coupling circuitry coupled to the output of the second voltage regulator and configured to receive an oscillator signal from an oscillator coupled to the output of the second voltage regulator.

16. A switch control circuit comprising:

a positive voltage bias node;

a first voltage regulator coupled to the positive voltage bias node and configured to provide a first positive voltage supply at an output of the first voltage regulator;

a second voltage regulator coupled to the positive voltage bias node and configured to provide a second positive voltage supply at an output of the second voltage regulator that is at least partially electrically isolated from the output of the first voltage regulator;

negative voltage generator circuitry coupled to the output of the second voltage regulator and configured to provide a negative voltage supply at an output of the negative voltage generator; and wherein each of the first voltage regulator and the second voltage regulator comprises an operational amplifier coupled to the positive voltage bias node at a first input of the operational amplifier and provide an amplified signal based at least in part on a signal received at the positive voltage bias node at an output of the operational amplifier, the output of the operational amplifier being coupled to a gate of a transistor.

* * * * *